(12) United States Patent
Chamberlin et al.

(10) Patent No.: US 8,819,931 B2
(45) Date of Patent: Sep. 2, 2014

(54) ENHANCED-RELIABILITY PRINTED CIRCUIT BOARD FOR TIGHT-PITCH COMPONENTS

(75) Inventors: Bruce John Chamberlin, Vestal, NY (US); Mitchell G. Ferrill, Little Meadows, PA (US); Roger Scott Krabbenhoft, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1714 days.

(21) Appl. No.: 12/173,795

(22) Filed: Jul. 15, 2008

(65) Prior Publication Data
US 2008/0271314 A1 Nov. 6, 2008

Related U.S. Application Data

(62) Division of application No. 11/457,492, filed on Jul. 14, 2006, now Pat. No. 7,615,705.

(51) Int. Cl.
*H05K 3/02* (2006.01)
*H05K 3/10* (2006.01)

(52) U.S. Cl.
USPC .................... 29/846; 29/830; 29/842; 29/852

(58) Field of Classification Search
USPC ............ 29/846, 830, 842, 852; 361/748, 749, 361/803; 428/375, 378, 392
See application file for complete search history.

(56) References Cited

U.S. PATENT DOCUMENTS

| | | | |
|---|---|---|---|
| 3,371,250 A | 2/1968 | Ross et al. | |
| 4,103,102 A | 7/1978 | Klein | |
| 4,980,217 A | 12/1990 | Grundfest et al. | |
| 5,165,166 A | 11/1992 | Carey | |
| 5,777,855 A * | 7/1998 | Yokajty | 361/803 |
| 6,949,289 B1 * | 9/2005 | Lawton et al. | 428/372 |

* cited by examiner

*Primary Examiner* — Thiem Phan
(74) *Attorney, Agent, or Firm* — Martin & Associates LLC; Derek P. Martin

(57) ABSTRACT

A printed circuit board is fabricated so contacts for tight-pitch components are at an angle with respect to the bundles of glass fibers in the epoxy-glass printed circuit board such that adjacent component contacts do not contact the same bundle of glass fibers. This angle may be accomplished by manufacturing a printed circuit board panel with the glass fibers at an angle with respect to its edges. This angle may also be accomplished by placing parts on a printed circuit board panel that has a traditional X-Y orthogonal weave of glass fiber bundles at an angle with respect to the edges of the panel. This angle may also be accomplished by starting with a traditional panel that has an X-Y orthogonal weave, laying out parts on the panel along the X-Y weave, then placing components on the parts at an angle with respect to the edges of the parts.

8 Claims, 7 Drawing Sheets

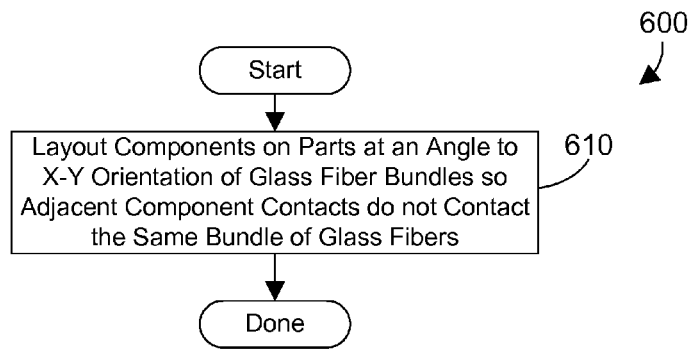
FIG. 6
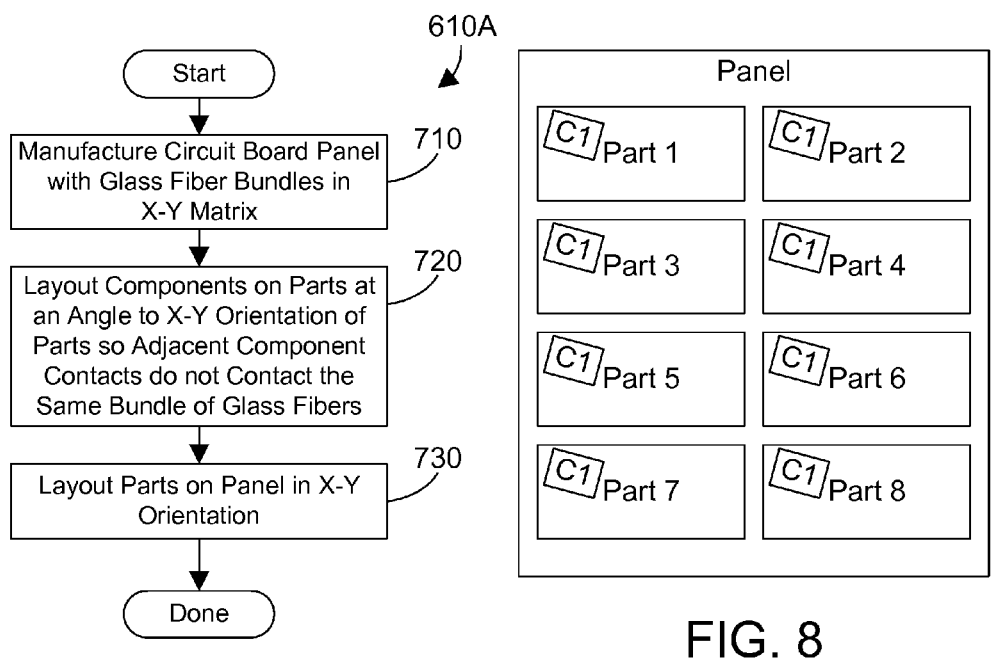
FIG. 7
FIG. 8

A = ArcSin(D/Pv)

B = ArcCos(D/Sqrt(Pv$^2$+Ph$^2$)) + ArcTan(Pv/Ph) - 90°

ENHANCED-RELIABILITY PRINTED CIRCUIT BOARD FOR TIGHT-PITCH COMPONENTS

CROSS-REFERENCE TO PARENT APPLICATION

This patent application is a division of U.S. Ser. No. 11/457,492 filed on Jul. 14, 2006, which is incorporated herein by reference.

BACKGROUND

1. Technical Field

This disclosure generally relates to circuit boards, and more specifically relates to printed circuit boards for tight-pitch components.

2. Background Art

Printed circuit boards are commonly constructed of glass cloth impregnated with various epoxy resins. The glass cloth is typically constructed of bundles of glass fibers woven together in an X-Y orthogonal fashion, with the bundles being perpendicular to each other. The epoxy/glass substrate is laminated to copper foil, forming "cores" which are subsequently etched to form the desired features. These cores are then laminated together using partially cured epoxy/glass layers with temperature and pressure, causing the resin to flow between layers to form a robust composite structure.

One mechanism that may impact reliability in traditional epoxy/glass printed circuit boards is known as Conductive Anodic Filament (CAF) growth. CAF growth results when a pathway exists along or within the individual glass fibers within the printed circuit board where a conductive path may form. In essence, a conductive filament of copper salts may grow along one or more of the glass fibers when there is both voltage and moisture present, such as when equipment operates in a high humidity environment. The conductive filament may eventually grow to a length sufficient to short together two features that should not be connected, such as adjacent plated-through holes in the printed circuit board, causing the printed circuit board to fail. CAF growth has been attributed to one or more of several possible scenarios, including: 1) hollow glass fibers as a result of bubbles in the liquid glass during the extrusion process that forms the glass fibers; 2) insufficient binding of the resin to the glass fibers, which may occur when the resin is initially bound to the glass fibers, or may occur only after exposure to thermal cycles, such as those that occur during normal system operation; 3) insufficient impregnation of the resin into the bundles of glass fibers, leaving small open tracks where multiple glass fibers meet (sometimes called a "triple point"). Note that CAF growth is well-understood in the art, and its underlying mechanisms therefore are not discussed further here.

CAF growth has been documented and understood for some time, but in the past CAF growth has not been a significant reliability concern for printed circuit boards because the time required for a conductive filament to grow between features on a printed circuit board typically has been greater than the life expectancy of the system in which the printed circuit board is located. However, the spacing between conductive leads or contacts on electronic components (referred to in the art as "pitch") continues to shrink. As a result, the time it takes for a CAF growth to bridge two features on a printed circuit board shrinks correspondingly. With the advent of sub-1 mm and lower pitch components, the CAF growth has now been shown to occur within the time frame of system life expectations. As a result, CAF growth becomes a reliability concern for printed circuit boards with tight-pitch components. One possible way to diminish the possibility of CAF growth is to address the three causes enumerated above during the manufacture of the epoxy/glass printed circuit board. However, these causes of CAF growth are not easily eliminated. Without a way to provide a printed circuit board that has enhanced resistance to failure caused by CAF growth, the electronics industry will be plagued by failures in printed circuit boards that have tight-pitch components due to CAF growth.

BRIEF SUMMARY

A printed circuit board is fabricated such that component contacts for tight-pitch components are at an angle with respect to the bundles of glass fibers in the epoxy-glass printed circuit board such that adjacent component contacts do not contact the same bundle of glass fibers. This angle may be accomplished by manufacturing a printed circuit board panel with the glass fibers at an angle with respect to its edges. Parts and components are then laid out on the panel in an X-Y orientation with respect to the panel's edges. In the alternative, this angle may be accomplished by placing parts on a printed circuit board panel at an angle with respect to the edges of the panel that has a traditional X-Y orthogonal weave of glass fiber bundles. Components are then laid out on the parts in an X-Y orientation with respect to the part's edges. This angle may also be accomplished by starting with a traditional panel that has an X-Y orthogonal weave of glass fiber bundles, laying out parts on the panel along the X-Y weave, then placing components on the parts at an angle with respect to the edges of the parts. By creating an angle between features in a printed circuit board and the underlying weave of glass fiber bundles, the paths between features in the printed circuit board that contact the same bundle of glass fibers is lengthened, thereby minimizing the reliability impact of CAF growth on epoxy/glass printed circuit boards.

The foregoing and other features and advantages will be apparent from the following more particular description, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and:

FIG. 6 is a flow diagram of a method for laying out components on a printed circuit board at an angle with respect to the X-Y orientation of the glass fiber bundles in the printed circuit board;

FIG. 7 is a flow diagram of one specific way of laying out components on a printed circuit board at an angle with respect to the X-Y orientation of the glass fiber bundles in the printed circuit board by placing the components at an angle with respect to the X-Y orientation of parts on a panel;

FIG. 8 is a diagram that illustrates a possible result of method 610A in FIG. 7;

DETAILED DESCRIPTION

A printed circuit board is fabricated such that a plurality of component contacts on the printed circuit board are disposed at an angle with respect to the X-Y array of glass fiber bundles in the substrate of the printed circuit board so that adjacent component contacts will not contact the same glass fiber bundle. The result is that paths between component contacts along the same glass fiber bundle are longer than the component pitch, thereby minimizing the likelihood of Conductive Anodic Filament (CAF) growth causing a failure in the printed circuit board. Note that the term X-Y orientation is used herein as shorthand to bring to mind the X and Y axes of a Cartesian graph, where the X axis is horizontal and the Y axis is vertical.

Figure 1:
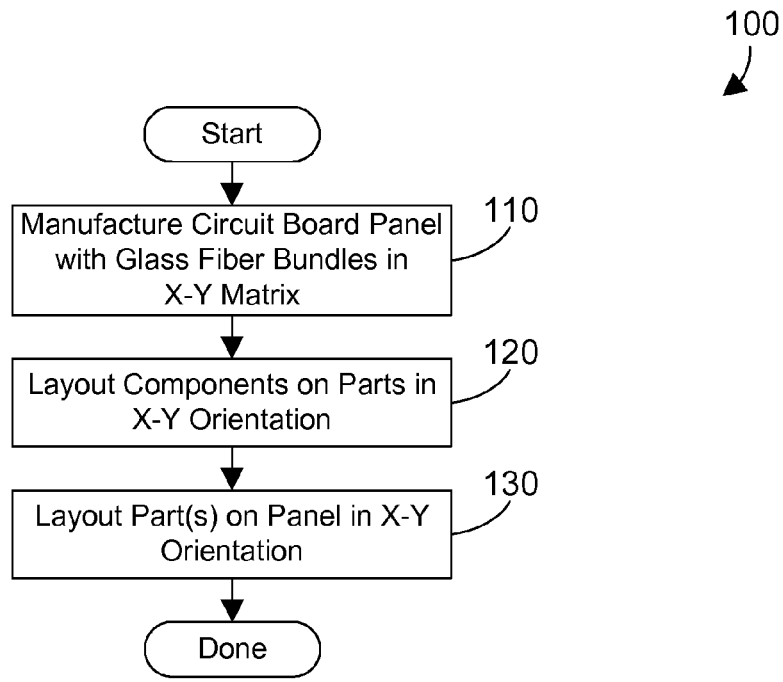
FIG. 1 is a known method for manufacturing panels, laying out parts, and laying out components on printed circuit board panels.
Figure 2:
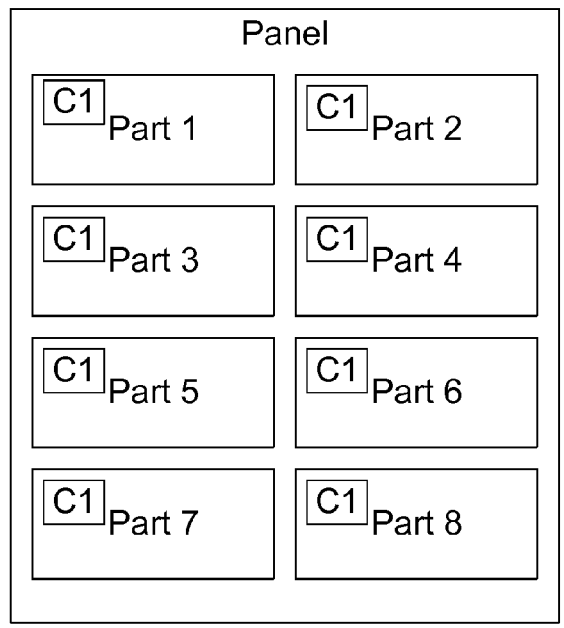
FIG. 2 is a simplified example showing a panel, parts, and components that are all laid out in the same X-Y orientation as the underlying orthogonal weave of the glass fiber bundles in the printed circuit board.

Referring to FIG. 1, a prior art method 100 for fabricating a printed circuit board begins by manufacturing a circuit board panel with glass fiber bundles in an orthogonal X-Y matrix (step 110). The components are then laid out on the parts in the same X-Y orientation (step 120). One or more parts are then laid out on the panel in the same X-Y orientation (step 130). This means that the parts have edges that are parallel to and perpendicular to the edges of the panel. The result is a panel with parts and components that all align with the X-Y orientation of the glass fiber bundles in the underlying panel, as shown by sample panel 200 in FIG. 2, which is shown with eight identical parts with edges parallel and perpendicular to the panel edges, where each part has a component C1 that has contacts that are also aligned parallel and perpendicular to the part edges.

Conductive Anodic Filament (CAF) growth is a known failure mechanism for printed circuit boards. Copper salts may form along a bundle of glass fibers in the presence of voltage and moisture, and may eventually form a conductive bridge between component contacts that causes a failure of the printed circuit board assembly. The term "pitch" herein refers to spacing between component contacts. As the pitch continues to shrink, the length of the path between adjacent component contacts is reduced, thereby reducing the time required for a conductive bridge to form between component contacts that contact the same glass fiber bundle in the printed circuit board. With component pitches of 1.0 mm or less, the time required for a conductive bridge to form between adjacent component contacts via CAF growth may be less than the anticipated life of the electronic assembly, which can result in premature failure of the electronic assembly.

Figure 3:
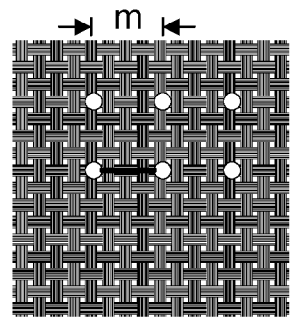
FIG. 3 is a diagram showing a potential path for CAF growth between plated-through holes in a known printed circuit board.

FIG. 3 shows some component contacts in the form of plated-through holes in a substrate that includes a woven matrix of glass fiber bundles in an X-Y arrangement as shown. Because adjacent component contacts are aligned on the same glass fiber bundle, the path along a glass fiber bundle where CAF growth may occur is governed by the pitch of the component contacts. Thus, in FIG. 3, the distance m between plated through holes is the distance where CAF growth can cause a failure in the printed circuit board assembly.

Figure 4:
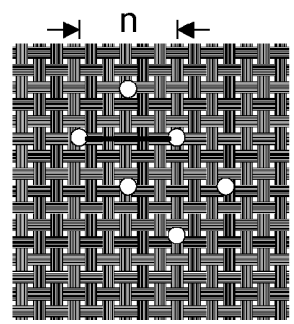
FIG. 4 is a diagram that shows how the length of a path for CAF growth can be lengthened by placing a component at an angle with respect to the underlying X-Y orientation of the glass fiber bundles in the printed circuit board.
Figure 5:
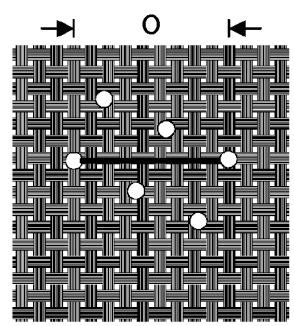
FIG. 5 is a diagram that illustrates that the length of the path for CAF growth can be lengthened even more by providing a different angle for the component plated-through holes with respect to the underlying X-Y orientation of the glass fiber bundles in the printed circuit board.

An enhanced-reliability circuit board may be fabricated by aligning component contacts so that adjacent component contacts do not contact the same glass fiber bundle in the printed circuit board, as shown in FIGS. 4 and 5. The angle shown in FIG. 4 results in a distance n that is larger than distance m in FIG. 3 for the same pitch components. In fact, the path shown in FIG. 4 is approximately 40% longer than the path shown in FIG. 3. By simply placing the component contacts at an angle with respect to the orthogonal X-Y matrix of glass fiber bundles in the printed circuit board substrate, the likelihood of CAF growth causing a failure is reduced.

Adjusting the angle of the component contacts with respect to the X-Y matrix of glass fiber bundles may further increase the distance between component contacts that contact the same glass fiber bundle, as shown in FIG. 5. The distance o along a glass fiber bundle is greater than distance n in FIG. 4 and greater than distance m in FIG. 3. In the broadest and strictest sense of the term "angle", zero degrees and ninety degrees are angles. However, the angle herein that results in adjacent component contacts not contacting the same glass fiber bundle are non-zero and non-ninety degree angles.

Figure 9:
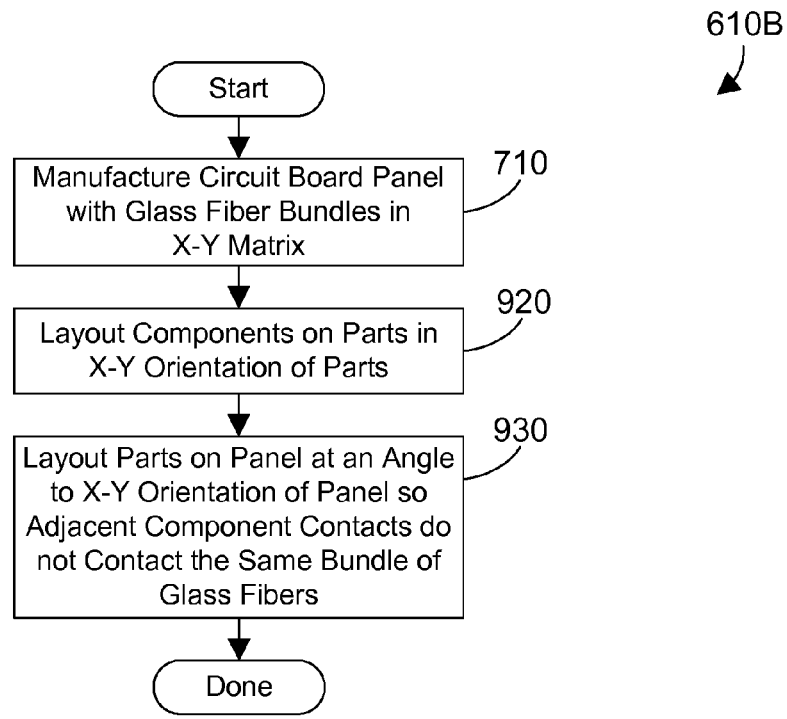
FIG. 9 is a flow diagram of one specific way of laying out components on a printed circuit board at an angle with respect to the X-Y orientation of the glass fiber bundles in the printed circuit board by laying out parts on a panel at an angle with respect to the X-Y orientation of the panel.
Figure 10:
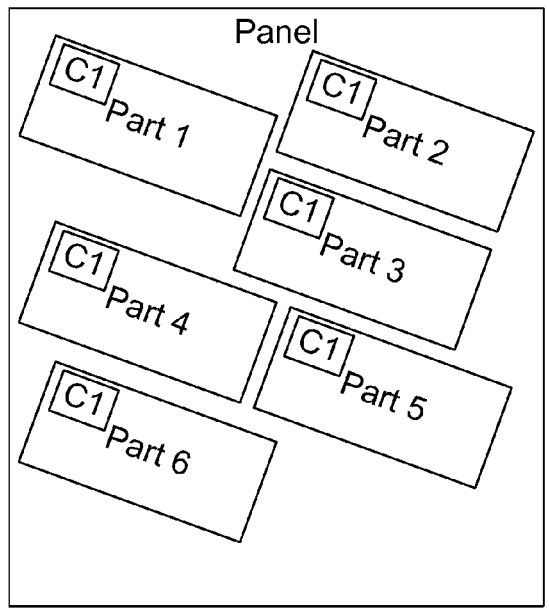
FIG. 10 is a diagram that illustrates a possible result of method 610B in FIG. 9.
Figure 11:
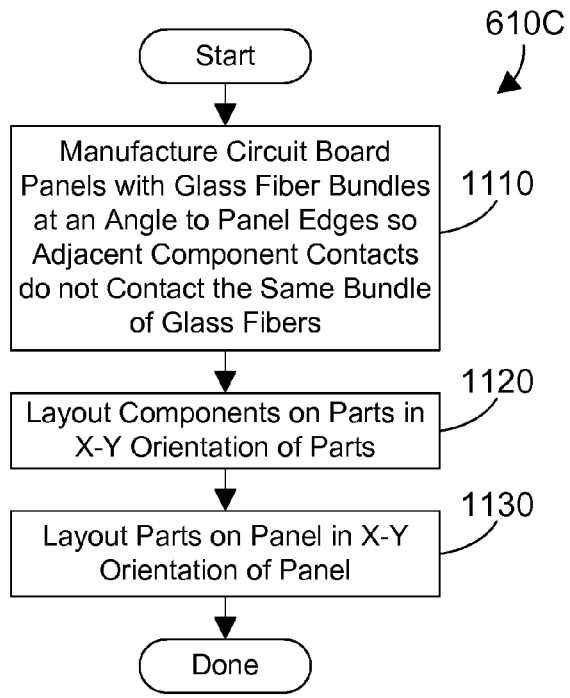
FIG. 11 is a flow diagram of one specific way of laying out components on a printed circuit board at an angle with respect to the X-Y orientation of the glass fiber bundles in the printed circuit board by manufacturing a panel that has glass fiber bundles at an angle with respect to its edges, then laying out parts and components on the panel in alignment with the edges of the panel.

Referring to FIG. 6, a method 600 includes the step of laying out components on parts at an angle with respect to the X-Y orientation of the glass fiber bundles in the printed circuit board so adjacent component contacts do not contact the same bundle of glass fibers (step 610). Step 610 may be accomplished in a number of different ways. Three of those ways are shown in FIGS. 7, 9 and 11, with the resulting structures shown in FIGS. 8, 10 and 12, respectively. Referring to FIG. 7, a first method 610A for performing step 610 in FIG. 6 begins by manufacturing a circuit board panel with the glass fiber bundles in a traditional X-Y matrix (step 710). The components on the individual parts are then laid out at an angle with respect to the X-Y orientation of the parts so adjacent component contacts do not make contact with the same bundle of glass fibers in the underlying substrate of the part and panel (step 720). Parts are then laid out on the panel in X-Y orientation (step 730). Note that all of the components need not be laid out at an angle. Tight-pitch components could be laid out at an angle while other components are laid out in X-Y orientation. The disclosure and claims herein express extend to laying out one or more components at an angle so that adjacent component contacts do not contact the same bundle of glass fibers. The result is shown graphically in FIG. 8, where the panel and parts are fabricated and laid out in X-Y orientation, the same as in the prior art shown in FIG. 2, but where one or more of the components on the parts are laid out at an angle with respect to the edges of the parts and the edges of the panel.

Another method 610B for performing step 610 in FIG. 6 is shown in FIG. 9. A circuit board panel is manufactured with glass fiber bundles in an X-Y matrix (step 710). The components are then laid out on the parts in an X-Y orientation with respect to the part edges (step 920). The parts are then laid out at an angle with respect to the X-Y orientation of the panel such that component contacts that are laid out in the following step do not contact the same bundle of glass fibers in the underlying substrate of the part and panel (step 930). This configuration is shown in FIG. 10. By placing the parts at an angle and placing the components in an X-Y arrangement with respect to the edges of the parts, the desired angle is achieved that assures that adjacent component contacts do not contact the same bundle of glass fibers in the underlying substrate of the part and panel.

Figure 12:
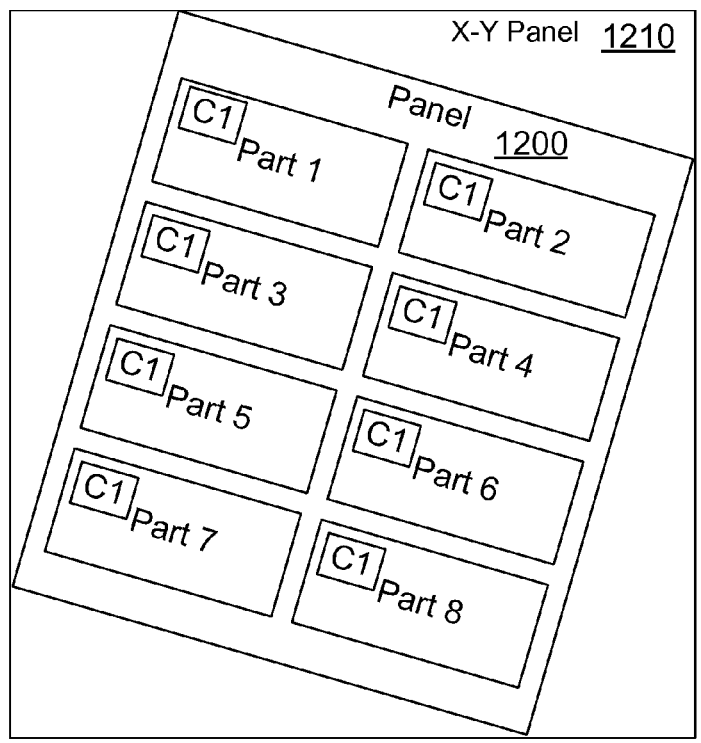
FIG. 12 is a diagram that illustrates a possible result of method 610C in FIG. 11.

Another method 610C for performing step 610 in FIG. 6 is shown in FIG. 11. A circuit board panel is manufactured with glass fiber bundles at an angle with respect to the edges of the panel so adjacent component contacts laid out in step 1130 do not contact the same bundle of glass fibers (step 1110). The components are then laid out on the parts in an X-Y orientation with respect to the edges of the parts (step 1120). The parts are then laid out in an X-Y orientation with respect to the edges of the panel (step 1130). This configuration is shown in FIG. 12. One way method 610C could be achieved is shown in FIG. 12, where a panel 1200 is cut from a large panel 1210 that has the glass fiber bundles in a traditional orthogonal X-Y matrix. Cutting the panel 1200 at an angle with respect to the X-Y panel 1210 results in a panel that has angled bundles of glass fibers to start with. As a result, the manufacturing process for laying out parts and components in method 610C of FIG. 11 will be identical to the prior art method that results in the layout shown in FIG. 2. The panel, parts and components in panel 1200 in FIG. 12 are all shown at an angle to simply represent that the edges of panel 1200 are at an angle with respect to the orthogonal X-Y array of glass fiber bundles in the larger panel 1210. Once panel 1200 is cut at an angle as shown in FIG. 12, the part and component layouts can be performed as in the prior art.

Figure 13:
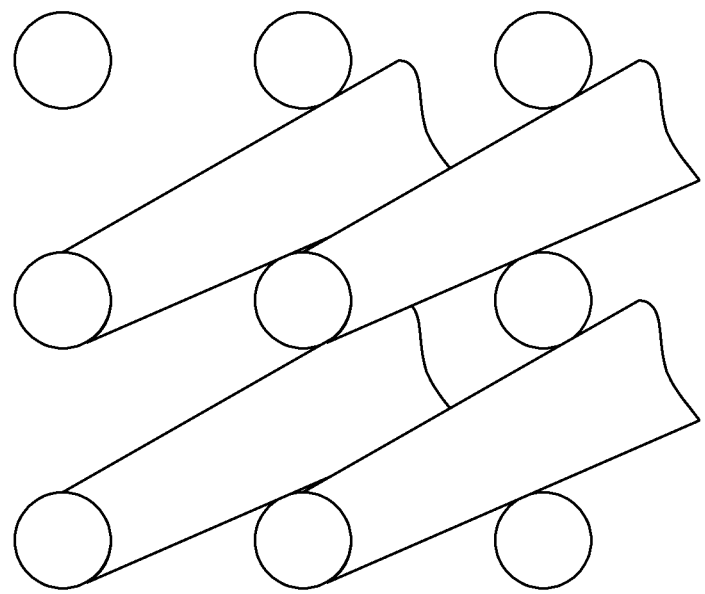
FIG. 13 is a diagram showing angled paths that result in adjacent features in a printed circuit board not being connected to the same bundle of glass fibers when the adjacent features are arranged in an orthogonal array as shown.
Figure 14:
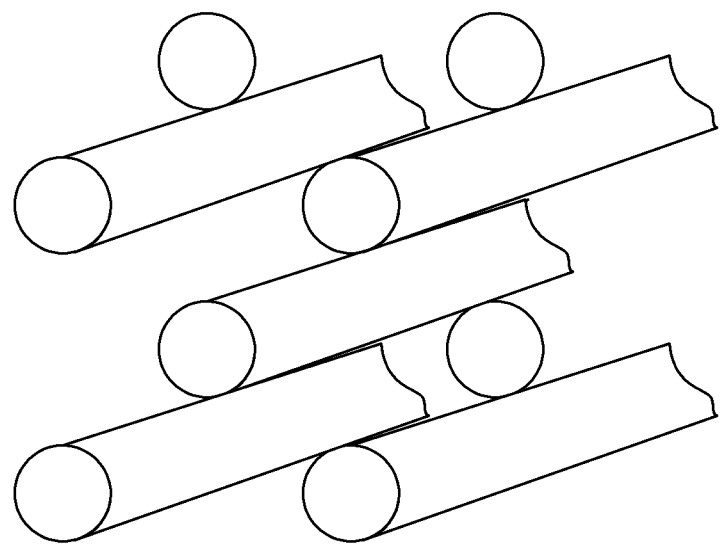
FIG. 14 is a diagram showing angled paths that result in adjacent features in a printed circuit board not being connected to the same bundle of glass fibers when the adjacent features are arranged in an interstitial array as shown.

FIG. 13 shows graphically paths that avoid contacts between adjacent component contacts in an orthogonal array of component contacts. FIG. 14 shows graphically paths that avoid contacts between adjacent component contacts in an interstitial array of component contacts. In both cases, the angle is preferably selected so that no bundle of glass fibers will contact two adjacent component contacts.

Figures 15, 16:
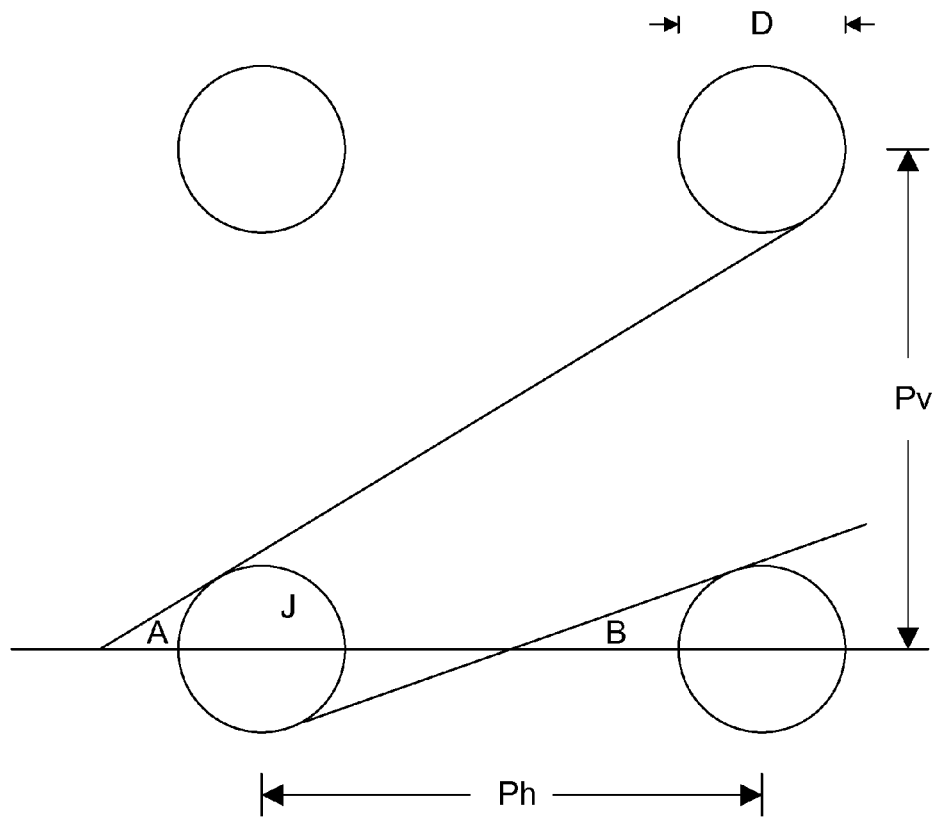
FIG. 15 is a diagram showing angles for a path in an orthogonal array such as that shown in FIG. 13.
FIG. 16 shows formulas for calculating the angles for the path shown in FIG. 15.

The angle may be calculated as shown in FIGS. 15 and 16. Referring to FIG. 15, we assume plated-through holes of diameter D are used, with a horizontal distance Ph between plated-through holes and a vertical distance Pv between plated-through holes. As shown by the lines extending from plated-through hole J in FIG. 15, the angles of these lines define angles which will assure that adjacent component contacts do not contact the same glass fiber bundle. The angle A shown in FIG. 15 is computed as shown in FIG. 16 to be the arcsine of the diameter D of the plated through hole divided by the vertical distance Pv between the centers of the plated through holes. The angle B shown in FIG. 15 is computed as shown in FIG. 16. The result is two angles that define an upper and lower bound for the angle at which component contacts are placed with respect to the orthogonal X-Y matrix of underlying glass fiber bundles in the printed circuit board substrate. The distance between component contacts along a glass fiber bundle will be maximized by selecting an angle that lies between angles A and B shown in FIG. 15 as computed in FIG. 16.

A printed circuit board provides enhanced reliability for tight-pitch components by assuring that adjacent component contacts do not contact the same glass fiber bundle in the underlying epoxy/glass substrate of the printed circuit board. By making sure that adjacent component contacts do not contact the same glass fiber bundle, the distance between component contacts along a glass fiber bundle is increased, thereby reducing the likelihood of failure due to CAF growth along the glass fiber bundle.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims. For example, while the discussion above refers to sub-1 mm pitch components, the printed circuit board and methods herein may be used on components of any pitch.

The invention claimed is:

1. A method for fabricating a printed circuit board, the method comprising the steps of:
   (A) fabricating a substrate comprising a plurality of glass fiber bundles woven together to form an X-Y matrix of glass fiber bundles; and
   (B) fabricating a plurality of component contacts in the substrate disposed at an angle with respect to the X-Y matrix of glass fiber bundles such that adjacent component contacts do not contact the same glass fiber bundle in the X-Y matrix.

2. The method of claim 1 wherein the angle is achieved by fabricating the substrate in step (A) with edges that are parallel with and perpendicular to the glass fiber bundles in the X-Y matrix, wherein step (B) comprises the step of fabricating the plurality of component contacts at non-zero and non-ninety degree angles with respect to the edges of the substrate.

3. The method of claim 1 wherein the angle is achieved by providing a substrate in step (A) with edges that are disposed at non-zero and non-ninety degree angles with respect to the X-Y matrix of glass fiber bundles and laying out the plurality of component contacts parallel and perpendicular to the edges.

4. The method of claim 3 wherein the substrate in step (A) with edges that are disposed at non-zero and non-ninety degree angles with respect to the X-Y matrix of glass fiber bundles is fabricated by performing the steps of:
   fabricating a panel with edges that are parallel with and perpendicular to the glass fiber bundles in the X-Y matrix; and
   fabricating the substrate on the panel with edges of the substrate that are disposed at non-zero and non-ninety degree angles with respect to the edges of the panel.

5. The method of claim 3 wherein the substrate in step (A) with edges that are disposed at non-zero and non-ninety degree angles with respect to the X-Y matrix of glass fiber bundles is fabricated by performing the steps of:
   fabricating a panel with edges that are disposed at non-zero and non-ninety degree angles with respect to the glass fiber bundles in the X-Y matrix; and fabricating the substrate on the panel with edges of the substrate that are parallel to and perpendicular to the edges of the panel.

6. The method of claim 1 wherein the angle is computed as $$ArcSin(D/Pv)$$

where D is the diameter of one of the component contacts; and

Pv is vertical distance between adjacent component contacts.

7. The method of claim 1 wherein the angle is computed as $$ArcCos(D/Sqrt(Pv^2+Ph^2))+ArcTan(Pv/Ph)-90°$$

where D is the diameter of one of the component contacts;

Pv is vertical distance between adjacent component contacts; and

Ph is the horizontal distance between adjacent component contacts.

8. The method of claim 1 wherein the angle is selected to lie between the following two computed angles:

$$ArcSin(D/Pv); \text{ and}$$

$$ArcCos(D/Sqrt(Pv^2+Ph^2))+ArcTan(Pv/Ph)-90°$$

where D is the diameter of one of the component contacts;

Pv is vertical distance between adjacent component contacts; and

Ph is the horizontal distance between adjacent component contacts.

\* \* \* \* \*